US005691110A

United States Patent [19]
Bohrer et al.

[11] Patent Number: 5,691,110
[45] Date of Patent: Nov. 25, 1997

[54] PROCESS FOR CONTROLLED DEPROTECTION OF POLYMERS AND A PROCESS FOR FABRICATING A DEVICE UTILIZING PARTIALLY DEPROTECTED RESIST POLYMERS

[75] Inventors: Michael Philip Bohrer, Lebanon; David Anton Mixon, Basking Ridge, both of N.J.

[73] Assignee: Lucent Technologies Inc., Murray Hill, N.J.

[21] Appl. No.: 277,852

[22] Filed: Jul. 20, 1994

Related U.S. Application Data

[62] Division of Ser. No. 234,501, Apr. 28, 1994, Pat. No. 5,385,809, which is a continuation of Ser. No. 8,029, Jan. 25, 1993, abandoned.

[51] Int. Cl.$^6$ .................................................. G03C 1/76
[52] U.S. Cl. .................... 430/270.1; 430/326; 528/491; 528/493
[58] Field of Search ............................ 430/270, 326, 430/270.1; 528/491, 493; 524/832

[56] References Cited

U.S. PATENT DOCUMENTS

| | | | |
|---|---|---|---|
| 4,491,628 | 1/1985 | Ito et al. | 430/176 |
| 4,812,542 | 3/1989 | Schwalm et al. | 526/265 |
| 5,045,431 | 9/1991 | Allen et al. | 430/270 |
| 5,066,566 | 11/1991 | Novembre | 430/296 |
| 5,071,730 | 12/1991 | Allen et al. | 430/270 |
| 5,073,474 | 12/1991 | Schwalm et al. | 430/270 |
| 5,075,199 | 12/1991 | Schwalm et al. | 430/281 |
| 5,182,185 | 1/1993 | Wu et al. | 430/192 |
| 5,350,660 | 9/1994 | Urano et al. | 430/270 |

FOREIGN PATENT DOCUMENTS

| | | |
|---|---|---|
| 2001384 | 4/1990 | Canada . |
| EP-A-0 366 590 | 10/1989 | European Pat. Off. . |
| A-53 081 116 | of 1978 | Japan .............. G03C 1/72 |

OTHER PUBLICATIONS

Ito et al. "Sensitive electron been resist systems based on acid–catalyzed deprotection", Advances in Resist Technology and Processing VI, SPIE 1086, 1989, pp. 11–21.

Brunsvold; et al. "Polyhydroxystyrene Carbonate esters for high sensitivity photoresists having autodecomposition temperatures" Advances in Resist Technology and Processing VI, SPIE 1086, 1989, pp. 357–362.

Ito, Hiroshi "Top Surface imaging systems utilizing poly-(vinylbenzoic acid) and its ester" J. Photopolym. Sci. Technol. vol. 5 (1), (1992), pp. 123–140.

Long et al. "The Thermal Deprotection Process in an E–Beam exposed Phenolic–based Polymer". Polymer Engineering and Science, Mid–Nov. 1992 (32) pp. 1589–1591.

Novembre et al. "X–ray and Deep UV Radiation Response of t–Butoxycarbonyl–Protected 4–Hydroxystyrene–Sulfone Copolymers." Irradiation of Polymeric Materials. vol. 527 (1993), pp. 179–196.

Shiraishi et al. "Novolak resin–based positive electron–beam resist system utilizing acid–sensitive polymeric dissolution inhibitor with solubility reversal reactivity". J. Vac. Sci. Technol. B 9 (6), Nov./Dec. 1991, pp. 3343–3347.

Primary Examiner—George F. Lesmes
Assistant Examiner—Steven H. VerSteeg
Attorney, Agent, or Firm—Richard J. Botos

[57] ABSTRACT

A process for enhancing the performance of resist polymers in lithographic processes for device fabrication is disclosed. The resist polymers contain acid labile functional groups. When these functional groups are removed and replaced by hydrogen, the polymer becomes more soluble in the aqueous base developer solutions used in lithographic processes. A portion of the acid-labile functional groups are cleaved from the polymer to obtain a resist polymer with increased sensitivity, improved adhesion, and reduced film shrinkage during post-exposure bake. The acid labile functional groups are cleaved by dissolving the polymer in a suitable solvent and subjecting the mixture to increased temperature until the desired number of acid labile functional groups are cleaved from the polymer. The polymer is then recovered from the mixture and employed as a resist in a lithographic process for device fabrication.

15 Claims, 4 Drawing Sheets

PROCESS FOR CONTROLLED DEPROTECTION OF POLYMERS AND A PROCESS FOR FABRICATING A DEVICE UTILIZING PARTIALLY DEPROTECTED RESIST POLYMERS

This application is a division of Ser. No. 08/234,501 filed Apr. 28, 1994 now U.S. Pat. No. 5,385,809 which is a continuation of Ser. No. 08/008,029 filed Jan. 25, 1993 now abandoned.

BACKGROUND OF THE INVENTION

1. Field of the Invention

This invention relates to a process for deprotecting chemically amplified resist materials in a controlled manner and the use of these materials in lithographic processes for device or photomask fabrication.

2. Art Background

Lithographic processes are typically employed in the manufacture of devices such as semiconductor devices, integrated optics, and photomasks. Such processes utilize various energy sources to create a relief image in a film of resist material applied onto a substrate. Energy sources that are typically used in lithographic processes include light and electron beam radiation.

Lithographic processes frequently employ resists that contain polymeric materials. Some polymeric resist materials, such as those described in U.S. Pat. No. 4,812,542, dated Mar. 14, 1989, have what is referred to as a protective group that is attached to the polymer. The protective group present in these materials is employed in the synthesis process to facilitate the formation of the resist material. In certain instances, such protective groups alter the solubility characteristics of the polymer.

Certain protective groups, when attached to the polymer, function as moieties at render the polymer relatively insoluble in alkaline solution. In lithographic processes, these moieties are removed upon irradiation and baking of the polymer film in the presence of a radiation-induced acid, and the polymer then becomes relatively more soluble in alkaline solutions. For example, in a synthesized polymer such as poly(4-tert-butoxycarbonyloxystyrene) the tert-butoxycarbonyl protective groups are removed and replaced by hydrogen to yield hydroxyl substituents. For convenience, "tert" will be shortened to "t" hereinafter. After a substantial percentage of the moieties (the t-butoxycarbonyl or other groups) have been cleaved from the exposed polymer, the polymer in the exposed region of the film is substantially more soluble in an aqueous alkaline developing solution.

The moieties are not cleaved from polymer in the unexposed regions. Therefore, the resist material in those regions is not as soluble in an alkaline solution. If an alkaline solution is used to develop the image projected onto the resist, the material in the exposed regions is dissolved by the developer solution while the material in the unexposed regions is not. It is by this mechanism that a positive tone image is developed that corresponds to the image projected into the resist material. Conversely, if the resist polymer in the unexposed regions is more soluble in the developer solution, then a negative tone image will be developed into the resist material.

If light is used as the energy source in a lithographic process, the process is referred to as photolithography. If such photolithographic processes utilize an exposure that occurs simultaneously over an entire device or a number of devices being processed on a substrate, the process utilizes what is considered a blanket exposure. A material, i.e., a resist, which is sensitive to the exposing radiation is coated onto a substrate, e.g., a silicon substrate, on which a plurality of devices will be formed. The coating material is (if desired) pre-exposure baked and is subjected to spatially discrete radiation, e.g., light that has been passed through a mask so that the light reaching the resist defines a discrete area. The discrete area defines a pattern that is to be transferred onto the underlying substrate either by negative or positive tone. The coated substrate is (if desired) post-exposure baked prior to image development of the discrete area on the substrate. The resists used in photolithography are referred to as "photoresists".

A blanket exposure is advantageous because it is relatively fast compared to other methods such as the raster scan technique that is employed when the energy used to expose the resist is a beam of electrons. However, generally, the resolution that is achieved through a blanket exposure with near ultraviolet or visible light is somewhat poorer than that achieved with other methods such as electron beam lithography.

Improved resolution with a blanket exposure can be achieved by using shorter wavelength light such as deep ultraviolet or X-ray light. One approach to a photoresist sensitive to shorter wavelength radiation employs a photoacid generator (PAG) that produces an acid moiety upon irradiation with deep ultraviolet light, together with a polymer that reacts under the influence of heat with the generated acid. In another approach, the polymer itself provides an acid functionality upon chain scission, thus eliminating the need for an added PAG.

As stated previously, protective groups are cleaved from the polymer in the presence of acid. In some lithographic processes, acid is provided by a PAG. Typical PAG/acid sensitive polymer combinations include an onium salt as the PAG and a polymer such as poly(4-t-butoxycarbonyloxystyrene) that has a reactive substituent, e.g., a t-butoxycarbonyl protective group. (See Ito, et al. U.S. Pat. No. 4,491,628 dated Jan. 1, 1985.) Typical acid sensitive polymers that provide an acidic functionality upon radiation-induced chain scission include poly(4-t-butoxycarbonyloxystyrene-sulfone). Such polymers are disclosed in U.S. Pat. No. 5,066,566 to Novembre. Such systems are generally referred to as chemical amplification systems since the production of one molecule of acid by radiation (e.g., light) induces a reaction in a plurality Of reactive substituents in the acid sensitive polymer. Since protective groups are not cleaved from the resist polymer in the unexposed regions, it follows that acid is preferably not generated or otherwise present in the unexposed regions.

Attempts have been made to improve the sensitivity and to reduce the fill shrinkage of chemically amplified resists. By improving the sensitivity of resists, less energy is required to create the image throughout the resist layer. In this regard, resist materials that have been partially deprotected (by the process disclosed in Canadian Patent Application 2,001,384, for example), have demonstrated enhanced sensitivity. Partial deprotection means that some, but not all, of the protective groups are cleaved from the polymer prior to the polymer's use in a lithographic process.

The '384 application states that some of the protective groups can be removed from the polymer by adding a strong acid such as sulfuric acid to the polymer which is in a heated solution. The acid is neutralized by the addition of base. The polymer is then isolated. The polymer is then combined with a PAG in a spinning solvent. This solution of polymer and PAG is then employed to spin coat a substrate which is subsequently exposed.

This process requires additional reactions after the acid-catalyzed deprotection to ensure the removal of added acid and base. A meticulous removal of the added acid is required before the resist is coated onto the substrate because any acid left in the polymer will degrade the polymer film upon post exposure baking. The added acid is neutralized by adding base. However, the base must be added carefully because any remaining base will neutralize a proportionate amount of photogenerated acid. The excess base must also be removed meticulously.

Although chemically amplified resists show great promise for fine line resolution, these materials have demonstrated a tendency to shrink after the exposure and post-exposure baking steps of the lithographic process. Shrinkage occurs when the protected polymer is heated in the presence of acid, which releases the protecting groups in the form of gaseous products such as $CO_2$ and isobutylene from the polymer. Such shrinkage produces a loss of image quality and, in part, counteracts resolution improvement available through use of deep ultraviolet, X-ray, or electron beam exposure. In device fabrication, because of particularly fine design rules, this film shrinkage can significantly affect the quality of the features produced in the lithographic process. Thus, although chemically amplified resists are extremely promising, some improvement is desirable.

SUMMARY OF THE INVENTION

Chemically amplified resists that contain polymers with protective groups are improved by partially deprotecting the chemically amplified resist polymer prior to application and use of the polymer as a resist. Acid or base is not added to the chemically amplified resist polymer, nor need it be removed, when chemically amplified resist polymers are partially deprotected using this process. Chemically amplified resist polymers so improved are more radiation sensitive and shrink less when used in lithographic processes for device fabrication. These chemically amplified resist polymers also exhibit better adhesion to silicon-containing substrates.

Chemically amplified resist polymers suited for use in the disclosed process have substituent groups pendant to the backbone of the polymer. Acid labile functional groups are attached to at least some of these substituent groups. In the disclosed process, a portion of these acid labile groups are cleaved from the resist polymer prior to the resist polymer's use in a lithographic process. The acid labile groups that are cleaved from the polymer are replaced by hydrogen. The acid labile functional groups act as protecting groups by altering the solubility of the polymer in aqueous base solutions. As more of these protective groups are removed and replaced by hydrogen, the polymer becomes more soluble in aqueous base solution.

The resist polymer containing the acid labile groups is dissolved in an organic solvent with a $pK_a$ of greater than 5 to form a polymer solution. Preferably, the organic solvent has a $pK_a$ of at least 15. These organic solvents are, therefore, preferably not strongly acidic. The polymer solution is heated to an elevated temperature of about 100° to 150° C.. The temperature selected depends upon the amount of deprotection that is desired in a particular time frame.

The solution is maintained at the elevated temperature for an amount of time that is sufficient to cleave a significant percentage, preferably at least 5%, of the acid labile groups from the polymer. A time period of seven hours or more may be utilized, however, much shorter time periods are contemplated to comply with processing constraints. When the polymer has been deprotected to the desired degree, the solution is cooled. The solution is cooled sufficiently quickly to avoid further deprotection. The partially deprotected polymer is then precipitated from the solution by adding a non-solvent such as water or a suitable organic non-solvent to the solution. The polymer is recovered from the solution using conventional techniques such as filtration. The partially deprotected polymer is preferably washed and dried under vacuum. After the polymer has been deprotected to the desired degree, it is employed as a resist in a process for device fabrication. The resist polymer so deprotected is thus free of any added acid or base.

The acid labile group is an alkoxy carbonyl group or an alkyl group. The acid labile group is preferably a t-butoxycarbonyl (TBOC) group or a t-butyl group.

The polymer is any polymer suited for use as a resist polymer to which suitable acid labile groups will attach. Suitable polymers to which these acid labile functional groups are attached include polymers that contain 4-t-butoxycarbonyloxystyrene, N-t-butoxycarbonylmaleimide, t-butylmethacrylate, and t-butylvinylbenzoate. These polymers can either be homopolymers of the above or copolymers such as poly(styrene-t-butoxycarbonyloxystyrene), poly(t-butoxycarbonyloxystyrene-sulfone), and poly(styene-N-t-butoxycarbonylmaleimide). Terpolymers such as poly(styrene-t-butoxycarbonyloxystyrene-maleimide) and poly(acetoxystyrene-t-butoxy carbonyloxystyrene-sulfone) are also suitable. Tetra polymers such as poly(styrene-t-butoxycarbonyloxystyrene-maleimide-N-methylmaleimide) are also contemplated.

The organic solvent in which the polymer is dissolved can be any solvent in which both the completely protected polymer and the partially deprotected polymer are sufficiently soluble. Solvents are chosen which solubilize the resist polymer to the desired degree throughout the deprotection process. Not all solvents are suitable because, as the protective groups are removed, groups that increase the aqueous base solubility of the polymer, such as mine groups, hydroxyl groups, or carboxyl groups, remain in their place. The acid labile functional groups and the moieties remaining after the acid labile groups are removed provide the polymer with different solubility characteristics. As the number of acid labile groups removed from the polymer increases, the solubility characteristics of the protected polymer change. Therefore, organic solvents are chosen for their ability to sufficiently solubilize the polymer regardless of the number of acid labile protective groups that are cleaved from the resist polymer.

Non-acidic organic solvents have been found to be compatible with this controlled deprotection process. Such solvents have a $pK_a$ of greater than 5, and preferably have a $pK_a$ of at least 15. Examples of suitable solvents are acetone ($pK_a$ of about 20), and dimethylsulfoxide ($pK_a$ of about 31). Cyclohexanone is another example of a suitable organic solvent.

Preferably, the deprotection process occurs in the absence of oxygen. In this regard, the deprotection occurs in either a non-reactive atmosphere, such as argon gas, or under negative pressure, i.e., vacuum. As the polymer is deprotected, gaseous species such as $CO_2$ and isobutylene, are produced. If the deprotection takes place in a pressure vessel, the production of these gaseous species will increase the pressure in the vessel as the deprotection proceeds unless these gases are vented to the atmosphere. By monitoring the increase in pressure during deprotection, the extent of deprotection can be determined. However, these gaseous products can be vented to the atmosphere as they are generated, if desired.

The polymer, when deprotected to the desired degree, is used as a resist material in lithographic processes. The polymer is used without added PAG if the polymer contains a moiety that provides an acidic functionality upon radiation-induced chain scission. The polymer is used with added PAG, if the acid functionality provided by the PAG is required.

DETAILED DESCRIPTION

Figure 1:
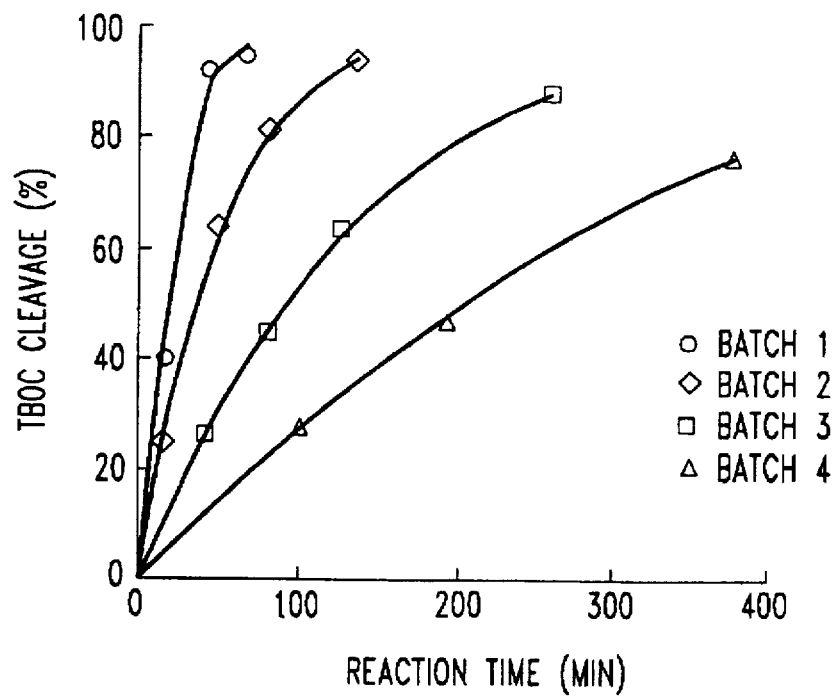
FIG. 1 illustrates the effect of temperature on the reaction time for cleaving t-butoxycarbonyl groups from poly(4-t-butoxycarbonyloxystyrene-sulfone) in a dimethylsulfoxide solvent.

The polymers deprotected according to this process are polymers to which acid labile functional groups are attached. The acid labile functional groups are used to manipulate the solubility of the polymer so that the polymer can be used as a resist in a lithographic process. For example, t-butoxycarbonyl (TBOC) groups are used to manipulate the solubility of hydroxystyrene-containing polymers. In these hydroxystyrene-containing polymers, most, i.e., greater than 95% of the hydroxyl groups are "protected". The hydroxyl groups on the aromatic ring of hydroxystyrene impart relatively greater alkaline (base) solubility to the resist polymer than other functional groups that do not contain the highly polar oxygen-hydrogen bond. "Protected" means that the acid labile functional group renders the resist polymer relatively less soluble in aqueous base solution.

When a significant number of acid labile functional groups are affixed to the polymer, the polymer is relatively less soluble in aqueous base solutions. When these functional groups are cleaved from the polymer, the polymer becomes more soluble in aqueous base solution.

"Acid labile" groups means that these groups are reactive in the presence of acid. The acid labile groups are reactive in the sense that they are cleaved from the polymer in a particular chemical environment. In the disclosed process, a suitable chemical environment is provided to cleave a desired number of these acid labile functional groups from the polymer. This environment is provided by heating a solution of the polymer dissolved in a suitable organic solvent. The process occurs in the absence of added acid. By manipulating the chemical environment in which the polymer with the acid labile groups is placed, and the amount of time the polymer is kept in that environment, the mount of acid labile groups that are cleaved from the polymer is controlled.

It is desirable to deprotect the polymer to a limited extent to increase the sensitivity of the resist material, reduce the film shrinkage, and improve the adhesion of the resist material to substrates. Some, but not all, of the acid labile groups are cleaved from the polymer. As more acid labile groups are cleaved from the polymer and replaced by hydrogen, the polymer becomes increasingly more soluble in the aqueous base solutions that are frequently used to develop positive-tone images in lithographic processes.

When developing resist materials in processes for device fabrication, it is important that the exposed and unexposed regions have different solubilities in the developing solution relative to each other to ensure that the developed image has adequate resolution and contrast. Therefore, it is important that the resin polymer only be deprotected to a controlled extent to ensure that there will be an adequate difference in the solubilities of the resist polymer in the exposed and unexposed regions. Consequently, the degree to which the protecting groups, i.e., the acid labile groups, are cleaved from the polymer is preferably controllable.

Removing a portion of the protective groups from the polymer, i.e., "partial deprotection", increases the sensitivity of the resist compared to resist polymers from which fewer protective groups have been removed. The sensitivity of a resist is a relative measurement determined by the amount of radiation necessary to achieve a particular effect.

Partial deprotection of the resist polymer also reduces the degree to which the polymer shrinks after the film is subjected to a post-exposure bake (PEB) just prior to the film being developed. Shrinkage is reduced because fewer protective groups are cleaved during PEB since a portion of the protective groups were cleaved from the polymer during the deprotection process. Less gaseous reaction products such as $CO_2$ and isobutylene are lost from the partially deprotected polymer during PEB, and the film shrinks less accordingly. Since film shrinkage adversely affects the image formed in the resist, it is desirable to reduce the mount the polymer shrinks during PEB. Resist polymers that are partially deprotected according to the disclosed process shrink significantly less than resist polymers that are not so partially deprotected.

In this process, a protected polymer is first dissolved in suitable organic solvent with a $pK_a$ of greater than 5, preferably with a $pK_a$ of at least 15. The resulting solution is then placed in an oxygen-free environment, either under vacuum or under a non-reactive gas atmosphere, and is heated to the desired reaction temperature. "Non-reactive" means that the gas does not substantially react with the polymer solution.

The reaction temperature is in the range of about 100° C. to about 150° C. The solution is maintained at the reaction temperature for a length of time necessary to deprotect the polymer to the desired degree. The length of time will vary depending upon the temperature at which the deprotection occurs, the nature of the solvent in which deprotection occurs, and the nature of the polymer being deprotected. At higher temperatures, deprotection occurs at a faster rate than at lower temperatures. Therefore, it will take longer to deprotect a particular polymer dissolved in a particular solvent to a particular degree at 110° C. as it will to deprotect the same polymer to the same degree at 130° C.

The length of time it takes to partially deprotect a polymer is also subject to processing constraints. The longer it takes to partially deprotect the polymer, the longer it will take to practice this process. At reaction temperatures of 100° C. to 150° C., the resist polymers are deprotected to the desired degree in less than seven hours. Preferably, the polymers are deprotected to the desired degree in less than three hours.

The solution is cooled according to known techniques. Preferably, the solution is cooled to below 100° C. in a relatively short length of time, e.g., fifteen minutes or less, to avoid deprotecting the polymer more than the desired degree. The cooled solution is then added to a non-solvent such as water or a suitable non-aqueous non-solvent such as hexane or the like. The deprotected polymer precipitates from the non-solvent. The deprotected polymer is then separated from the non-solvent using a common separation method such as filtration. The deprotected polymer is washed simultaneously to remove the remaining solvent. Traces of the non-solvent and solvent are preferably removed using known methods such as vacuum drying. The deprotected polymer is then made up into a resist solution by adding the polymer and, if required, a PAG, to a spinning solution. The deprotected polymer is then applied to a substrate and used as a resist in a process for device fabrication.

Suitable acid labile groups include alkyloxycarbonyl and alkyl groups, preferably t-butoxycarbonyl and t-butyl groups. These groups, when attached to the resist polymer via substituents pendant to the polymer backbone, render the resist polymer less soluble in aqueous base solution.

Monomers to which these acid labile groups are attached include 4-t-butoxycarbonyloxystyrene, N-t-butoxycarbonylmaleimide, t-butylmethacrylate, and t-butylvinylbenzoate. Suitable resist polymers which are deprotected according to this process include homopolymers of the above and copolymers such as poly(styrene-t-butoxycarbonyloxystyrene), poly(t-butoxycarbonyloxystyrene-sulfone), and poly(styrene-N-t-butoxycarbonylmaleimide). Terpolymers such as poly(styrene-t-butoxycarbonyloxystyrene-maleimide) and poly(acetoxystyrene-t-butoxycarbonyloxystyrene-sulfone) are also suitable. Tetrapolymers such as poly(styrene-t-butoxycarbonyloxystyrene-maleimide-N-methylameimide) are also contemplated.

Both the protected and partially deprotected polymers are preferably soluble in the organic solvent in which the deprotection process occurs. The organic solvents are preferably not strongly acidic, i.e., their $pK_a$ is preferably more than 5. Solvents such as dimethyl sulfoxide ($pK_a$ of about 31) and acetone ($pK_a$ of about 20), are examples of suitable solvents. Cyclohexanone is another example of a solvent suitable for use in this deprotection process.

The following Examples are illustrative of the invention. These examples are intended to illustrate and highlight the concepts embodied by the invention and are not intended to limit the scope of the claims which define this invention.

Example 1: Preparation of Poly(4-t-butoxycarbonyloxystyrene)

A t-butoxycarbonyloxystyrene (PTBS) homopolymer was synthesized by combining t-butoxycarbonyloxystyrene monomer (252 g) with toluene (60.9 g) in a reactor. The monomer was mixed with toluene and the mixture was vacuum-degassed. The reactor was charged with argon gas to a pressure of 20 psig. The reactor was then heated to 60° C. An initiator, 2,2'-azobis (2-methylbutanenitrile) (5.256 g), was then added to the reactor in a solution with toluene (48.9 g) to initiate polymerization of the monomer. The 2,2'-azobis (2-methylbutanenitrile) is sold under the trademark VAZO® 67, which is a trademark of the E. I. DuPont de Nemours Co., Inc. (DuPont).

After 360 minutes reaction time, the reactor was cooled and acetone (225 ml) was added to dilute the reaction mixture. The resulting PTBS was precipitated in methanol (1.8 liters). The PTBS was separated from the supernatant liquor and then repeatedly rinsed with methanol by decanting. The PTBS was then redissolved in acetone (500 g) and then reprecipitated in methanol (6 liters). The precipitate was then vacuum-filtered using a Buchner-type funnel, washed with methanol (1.5 liters) and then dried under vacuum at ambient temperature until the product reached a constant weight.

In addition to the PTBS polymer prepared according to the procedure described above, two other polymers were prepared by similar techniques. The polymers were a copolymer, poly(4-t-butoxycarbonyloxystyrene-sulfone) (PTBSS), and a terpolymer, poly(4-acetoxystyrene-4-t-butoxycarbonyloxystyrene-sulfone) (PASTBSS). Some of the properties of these three polymers are enumerated in Table I below.

TABLE 1

POLYMER PROPERTIES

| Polymer | Composition | | | Molecular Weight[4] | | Spectral Absorption | |
|---|---|---|---|---|---|---|---|
| | AS[1]:TBS[2] (mol ratio) | (AS + TBS):SO$_2$ (mol ratio) | Sulfur Content (wt %) | $\overline{M_w}$ (×10$^{-5}$) | $\dfrac{\overline{M_w}}{\overline{M_n}}$ | IR (1756 cm$^{-1}$) (AU/μm) | UV (248 nm) (AU/μm) |
| PTBS | 0 | 0 | 0 | 3.47 | 1.7 | 0.424 | 0.098 |
| PTBSS | 0 | 3.18 | 4.19 | 1.61 | 1.5 | 0.366 | 0.111 |
| PASTBSS | 0.66 | 2.75 | 5.28 | 0.95 | 1.6 | 0.336 | 0.298 |

[1]acetoxystyrene
[2]t-butoxycarbonyloxystyrene
[3]Measured using an oxidative combustion method.
[4]Measured by High Pressure Size Exclusion Chromatography.

Example 2: Controlled Deprotection of t-Butoxycarbonyloxystyrene-containing Polymers A pressure-resistant reactor (Parr Instrument Co., model 4563) with an internal volume of 617 ml was used as a vessel in which PTBSS was deprotected. The reactor was made of type 316 grade stainless steel. PTBSS (36 g) was dissolved in dimethylsulfoxide (DMSO) (180 g). The resulting polymer solution was transferred to the pressure vessel and stirred while the vessel was sequentially vacuum-evacuated and back-filled with argon gas three times. The pressure vessel was pressurized to 20 psia with argon gas. The vessel was rapidly heated to 140° C. and held at that temperature for 107 minutes. The vessel was then rapidly cooled by immersing the reactor body in an ice bath.

Samples of the polymer solution were collected using a pressure resistant manifold made of a type 316 stainless steel pre-sample tube (1.4 ml) and a sampling tube (10.0 ml), both of which were fitted with 3-way valves and interconnected with Teflon® tubing with an outer diameter of ⅛". Teflon is a registered trademark of DuPont. These three-way valves were used to divert the flow of polymer solution into the sample tubes, to flush acetone through the valve bodies and associated tubing, and to flow argon through the valves and associated tubing to dry them after sampling.

The contents of the sampling tube were then transferred to a 50 ml dripping funnel with acetone (22 ml). The polymer contained in the diluted sample was precipitated in water (500 ml). The precipitated polymer was then vacuum-filtered using a Buchner funnel equipped with hardened filter paper (#520-B obtained from Schleicher and Schuell). The recovered polymer solids were washed with additional water, and then dried under vacuum at ambient temperature to a constant weight.

The conditions under which the PTBSS polymer in this example was deprotected are enumerated in Table II below. The PTBSS polymer of this example is designated as Batch 1 in Table II. The other polymers enumerated in Table I were also deprotected according to the general procedure set forth in Example II, but under different conditions. The conditions under which those polymers were deprotected, as well as the composition of the polymers deprotected, are enumerated in Table II as well.

TABLE II

POLYMER DEPROTECTION CONDITIONS

| Batch | Temp (°C.) | Time (min) | Materials Added to Reactor | | | | Reaction Atmosphere | | |
|---|---|---|---|---|---|---|---|---|---|
| | | | Polymer | | Solvent | | | Initial | Final |
| | | | Type | Amount (g) | Type | Amount (g) | Type | Pressure (psia) | Pressure (psia) |
| 1 | 140 | 107 | PTBSS | 36 | DMSO | 180 | Ar | 20 | 155 |
| 2 | 130 | 141 | PTBSS | 36 | DMSO | 180 | Ar | 20 | 138 |
| 3 | 120 | 262 | PTBSS | 36 | DMSO | 180 | Ar | 20 | 133 |
| 4 | 110 | 533 | PTBSS | 36 | DMSO | 180 | Ar | 20 | 118 |
| 5[1] | 130 | 141 | PTBSS | 36 | DMSO | 180 | H$_2$ | 250 | 300 |
| 6 | 140 | 99 | PTBSS | 36 | acetone | 180 | Ar | 20 | 193 |
| 7 | 130 | 28 | PASTBSS | 15 | acetone | 75 | Ar | 20 | 110 |
| 8 | 130 | 146 | PTBSS | 36 | acetone | 180 | Ar | 20 | 130 |
| 9 | 140 | 75 | PTBSS | 36 | acetone | 180 | Ar | 20 | 168 |
| 10 | 140 | 55 | PTBSS | 36 | acetone | 180 | Ar | 20 | 156 |
| 11 | 140 | 173 | PTBS | 36 | acetone | 180 | Ar | 20 | 175 |
| 12 | 130 | 112 | PASTBSS | 36 | acetone | 180 | Ar | 20 | 145 |
| 13 | 130 | 36 | PASTBSS | 36 | acetone | 180 | Ar | 20 | 119 |

[1]In this run, the pressure rose to 300 psia and the reactor was vented back to 250 psia, several times

Example 3: Properties of Polymers Deprotected According to the Disclosed Process The polymers as prepared under the conditions enumerated in Table II were evaluated to determine their properties. Certain of the polymers were evaluated not only at 100% deprotection, but also at varying degrees of deprotection during the process. Specifically, the deprotected polymers were evaluated to determine their infrared absorbance, the extent to which they were deprotected, their absorbance of ultraviolet light at 248 nm, the sulfur content of the polymer, and the weight loss of the polymer during thermogravimetric (TGA) analysis. The properties of the various deprotected polymers are enumerated in Table III.

TABLE III

DEPROTECTED POLYMER PROPERTIES

| Batch | IR abs.[1] at 1756 cm$^{-1}$ (AU/μm) | Extent of[2] Deprotection (%) | UV abs.[3] at 248 nm (AU/μm) | Sulfur[4] Content (wt %) | TGA[5] Weight Loss (%) |
|---|---|---|---|---|---|
| 1 | 0.218 | 40 | 0.296 | — | — |
| 1 | 0.031 | 92 | 0.640 | — | — |
| 1 | 0.018 | 95 | 0.676 | — | — |
| 1 | 0 | 100 | 0.719 | — | — |
| 1 | 0 | 100 | 0.710 | — | — |
| 2 | 0.273 | 25 | 0.234 | — | — |
| 2 | 0.130 | 64 | 0.455 | — | — |
| 2 | 0.068 | 81 | 0.597 | — | — |
| 2 | 0.021 | 94 | 0.669 | — | — |
| 3 | 0.266 | 27 | 0.231 | — | — |
| 3 | 0.200 | 45 | 0.346 | — | — |
| 3 | 0.132 | 64 | 0.444 | — | — |
| 3 | 0.044 | 88 | 0.606 | — | — |
| 4 | 0.267 | 27 | 0.230 | — | — |
| 4 | 0.196 | 46 | 0.340 | — | — |
| 4 | 0.089 | 76 | 0.519 | — | — |
| 4 | 0.040 | 89 | 0.607 | — | — |
| 5 | 0.232 | 37 | 0.257 | — | — |
| 5 | 0.077 | 79 | 0.529 | — | — |
| 5 | 0.032 | 91 | 0.622 | — | — |
| 5 | 0 | 100 | 0.698 | — | — |
| 6 | 0.318 | 13 | 0.141 | 4.39 | — |
| 6 | 0.235 | 36 | 0.284 | 4.94 | — |
| 6 | 0.152 | 58 | 0.383 | 5.54 | — |
| 6 | 0 | 100 | 1.242 | — | — |
| 7 | .0309 | 11 | 0.238 | — | 25.6 |
| 8 | 0.363 | 1 | 0.144 | — | — |
| 8 | 0.325 | 11 | 0.169 | 4.49 | — |
| 8 | 0.292 | 20 | 0.228 | — | — |
| 8 | 0.244 | 33 | 0.285 | 5.00 | — |
| 8 | 0.232 | 37 | 0.292 | — | 29.5 |
| 9 | 0.153 | 58 | 0.382 | 5.57 | 23.4 |
| 10 | 0.193 | 47 | 0.312 | 5.29 | 25.9 |
| 11 | 0.421 | 1 | 0.102 | 0 | — |
| 11 | 0.276 | 35 | 0.123 | 0 | — |
| 11 | 0.207 | 51 | 0.126 | 0 | — |
| 12 | 0.304 | 12 | 0.282 | 5.51 | 25.4 |
| 12 | 0.251 | 33 | 0.385 | 5.78 | 19.4 |
| 12 | 0.160 | 57 | 0.494 | 6.31 | 12.5 |
| 12 | 0.097 | 82 | 0.619 | 6.74 | 5.1 |
| 12 | 0.070 | 95 | 0.672 | 6.92 | 1.5 |
| 13 | 0.269 | 10 | 0.232 | — | 26.0 |
| 13 | 0.249 | 12 | 0.287 | 5.59 | 25.3 |
| 13 | 0.234 | 23 | 0.321 | — | 22.1 |
| 13 | 0.244 | 27 | 0.342 | 5.72 | 21.0 |

[1]Samples were dissolved in 2-methoxyethyl acetate and spin-deposited onto silicon wafer fragments. Infrared spectra were measured using a Perkin Elmer Model 783 ratio recording spectrophotometer.
[2]Calculated from the intensity of the carbonyl absorbance at 1756 cm$^{-1}$ and the polymer film thickness for PTBS and PTBSS. The extent of deprotection of PASTBSS was measured based upon thermogravimetric analysis (TGA).
[3]Samples were dissolved in 2-methoxyethyl acetate and spin-deposited onto quartz disks. Ultraviolet spectra were measured using a Hewlett Packard diode array spectrophotometer (Model 8452 A).
[4]Measured using an oxidative combustion method.
[5]Thermogravimetric analysis (TGA) was carried out using a Perkin Elmer TGA-7 analyzer connected to a DEC personal workstation via a PAC7/DX thermal instrument controller.

Example 4: Lithographic Testing of t-Butoxycarbonyloxystyrene-Containing Polymers Several completely protected PTBSS and PASTBSS polymers, and several deprotected derivative polymers, were tested for their lithographic sensitivity and their film thickness loss following the post-exposure baking step (PEB) in a deep ultraviolet photolithographic process. The resist solutions were prepared by adding the PAG bis(2-trifluoromethyl-6-nitrobenzyl)-1,3,benzenedisulfonate (0.563 grams) to 3.75 grams of polymer and dissolving the mixture in 2-methoxyethyl ether (22.7 ml). The solutions were filtered through a 0.2 μm syringe filter and about 0.8 μm thick polymer films were spin coated onto silicon wafer substrates with a 4 inch diameter. The substrates were then pre-baked on a hot plate for 30 seconds at 120° C. in an air atmosphere.

The pre-baked coated substrates were exposed to deep ultraviolet light using a Karl Suss MA 56M contact aligner that was fitted with a Lambda Physik KrF laser ($\lambda$=248.7 nm). The laser was operated with a beam flux of either 2.1 or 2.8 mJ/cm$^2$/s. Coated substrates were exposed using proximity printing through a quartz Multidensity Resolution Target from Opto-Line Corporation. The coated substrates were then baked on a hot plate for 60 seconds at 120° C. in an air atmosphere. This second baking step is commonly referred to as a post-exposure bake (PEB).

The films were then developed in an aqueous solution of tetramethylammoniumhydroxide (0.28N) for 10 to 30 seconds. The sample from Batch 9 in Table III was developed in 0.22N tetramethylammoniumhydroxide. The developed films were rinsed with deionized water for 30 seconds. The thickness of the resulting rims were measured with a Nanometrics Nanospec AFT thickness gauge using a refractive index of 1.64 for the polymer films. The relationship between the normalized-resist-film-thickness-remaining-after-development and the logarithm of the incident radiation dose were plotted against each other. From this relationship, the sensitivities of certain polymers to deep ultraviolet light were calculated.

The polymer samples prepared as described in Table II were tested according the above described procedures. The results are reported in Table IV below. Table IV illustrates that both PTBSS and PASTBSS exhibited greater sensitivity, less film thickness loss, and greater UV absorbance at higher degrees of deprotection. Sensitivity was measured by comparing the clearing dose, $D_p$, of the various polymers. The clearing dose is the minimum dose of radiation required to remove all of the film during development.

TABLE IV

LITHOGRAPHIC COMPARISON OF NATIVE AND DEPROTECTED POLYMERS

| Polymer (batch) | Extent of Deprotection (%) | Sensitivity [$D_p$] (mJ/cm$^2$) | Film Thickness Loss In Exposed Area After PEB (%) | UV Absorbance of Polymer/ PAG Film at 248 nm (AU/μm) |
|---|---|---|---|---|
| PTBSS | 0 | 12 | 28 | 0.300 |
| (8) | 37 | 4 | 21 | 0.541 |
| (9) | 58 | 3 | 13 | 0.665 |
| (10) | 47 | 4 | 17 | 0.574 |
| PASTBSS | 0 | 38 | 21 | 0.424 |
| (13) | 30 | 23 | 16 | 0.517 |

The extent to which the polymer is deprotected affects the resist characteristics of the polymer. Therefore, it is important to deprotect the polymer to an extent that will optimize its performance as a resist. The following examples illustrate the effect that several parameters during the deprotection process have on the extent to which the polymers are deprotected, and the effect of the extent of deprotection on the resist properties of the polymer.

Example 5: Effect of Temperature on the Rate of Deprotection

The rate at which several PTBSS polymers were deprotected is illustrated in FIG. 1. The PTBSS polymers tested were batches 1, 2, 3 and 4 from Table II. The conditions under which these polymers were deprotected are also enumerated in Table II. FIG. 1 illustrates that the rate at which the TBOC group is cleaved from the polymer is much faster when the temperature is 140° C. (Batch #1) than when the deprotection temperature is 110° C. (Batch #4). In order to establish a uniform basis for comparison, the point in time when the polymer solution reached 110° C. was taken as the starting time.

Example 6: The Effect of the Solvent on the Rate of Deprotection

Figure 2:
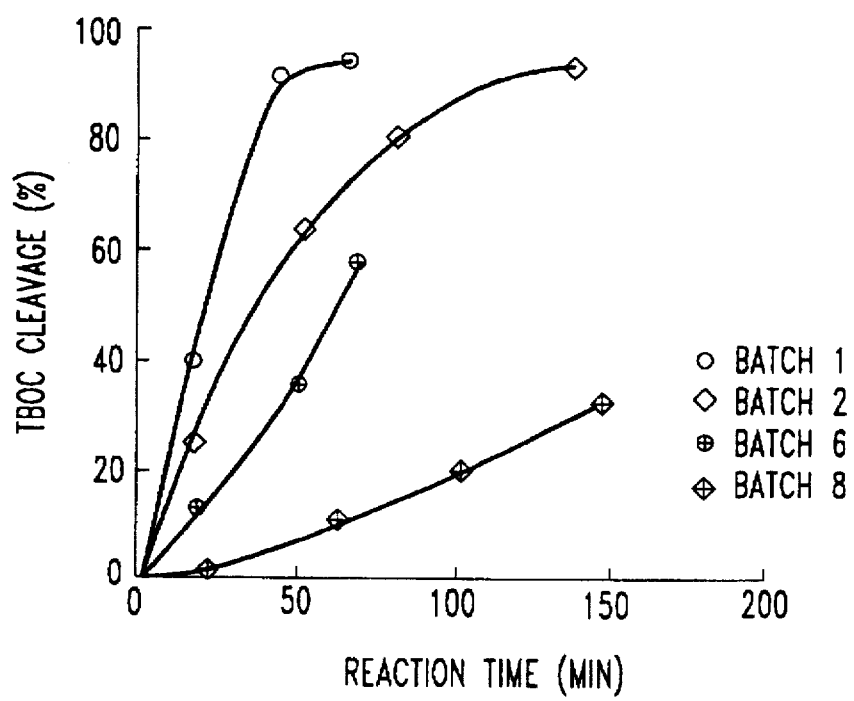
FIG. 2 compares the effects of using dimethylsulfoxide and acetone as solvents on the reaction time for cleaving t-butoxycarbonyl groups from poly (4-t-butoxycarbonyloxystyrene-sulfone).

The solvent used in the deprotection process also affects the rate at which the polymer is deprotected. This solvent effect is illustrated in FIG. 2. The rate at which TBOC groups are cleaved from PTBSS is much faster in dimethylsulfoxide (DMSO) (Batches 1 and 2) than in acetone (Batches 6 and 8) at a certain temperature (140° C. for Batches 1 and 6; 130° C. for Batches 2 and 8).

Example 7: The Effect of the Polymer on the Rate of Deprotection

Figure 3:
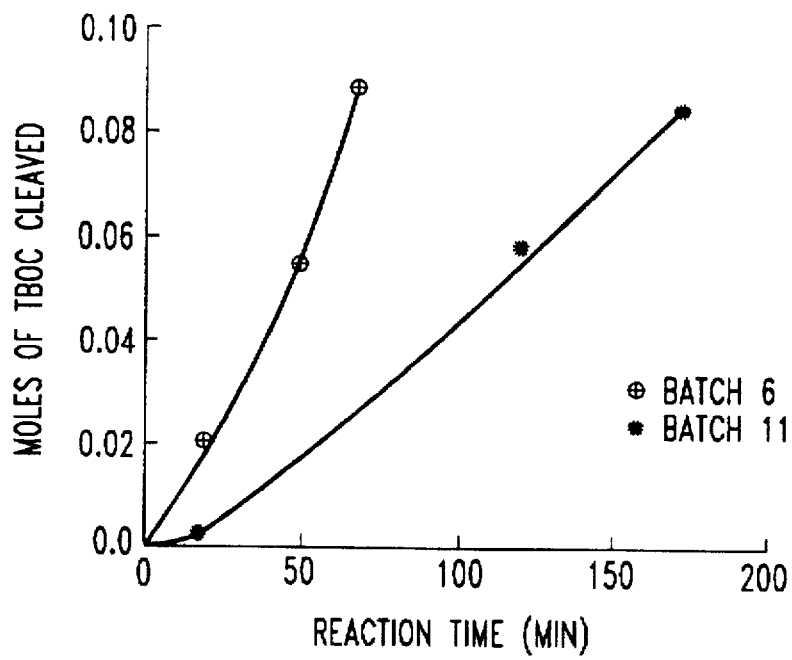
FIG. 3 is a comparison of the rates at which t-butoxycarbonyl groups are cleaved from poly(4-t-butoxycarbonyloxystyrene) and poly(4-t-butoxycarbonyloxystyrene-sulfone) at 140° C. using acetone as a solvent.

The rate at which the t-butoxycarbonyloxystyrene-containing polymer is deprotected is affected by the composition of the polymer itself. FIG. 3 illustrates that the rate at which PTBSS was deprotected (Batch 6) was substantially greater than the rate at which PTBS was deprotected (Batch 11). The different polymers were deprotected in the same type of solvent (acetone) and at the same temperature (140° C.) as a control. The PTBSS copolymer contains sulfone groups, whereas the PTBS homopolymer does not.

Figure 4:
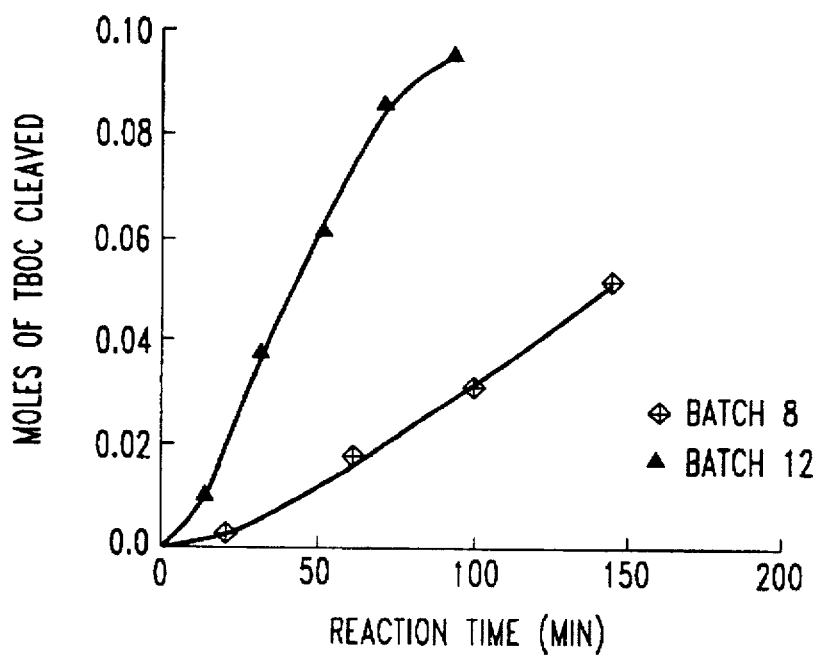
FIG. 4 is a comparison of the rates at which t-butoxycarbonyl groups are cleaved from poly(4-t-butoxycarbonyloxystyrene-sulfone) and poly(4-acetoxystyrene-4-t-butoxycarbonyloxystyrene-sulfone) at 130° C. using acetone as a solvent.

Similarly, FIG. 4 illustrates that the rate at which PASTBSS was deprotected (Batch 12) was faster than the rate at which PTBSS was deprotected (Batch 8). Again as a control, both polymers were deprotected in the same type of solvent (acetone) and at the same temperature (130° C.). The fact that PASTBSS was deprotected at a faster rate may be due to the greater amount of $SO_2$ per mole of styrene in PASTBSS than in PTBSS, as shown in Table 1.

Figure 5:
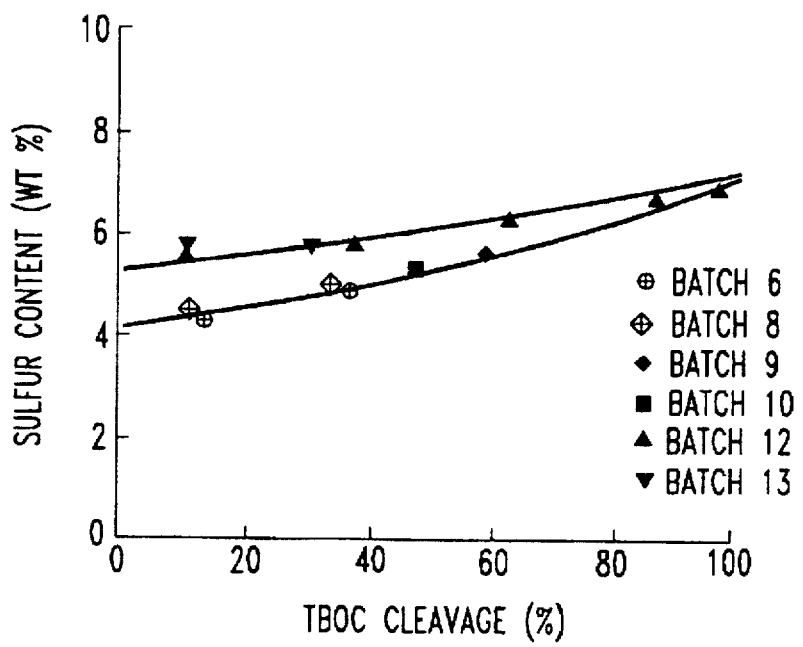
FIG. 5 compares the actual sulfur content of poly(4-t-butoxy carbonyloxystyrene-sulfone) and poly(4-acetoxystyrene-4-t-butoxycarbonyloxystyrene-sulfone) at varying degrees of cleavage of the t-butoxycarbonyl groups from these polymers with the theoretical sulfur content of these same polymers assuming no sulfur loss.

Example 8: The Effect of the Deprotection Process on the Sulfur Content of the Deprotected Polymers Sulfur-containing polymers do not lose sulfur as the TBOC groups are cleaved from the polymer using the process disclosed herein. This is illustrated in FIG. 5 wherein the theoretical sulfur content of PTBSS and PASTBSS at various stages of deprotection are plotted as solid lines. The theoretical sulfur content assumes no loss of sulfur from the polymer during the deprotection process. The sulfur content of PTBSS (Batches 6, 8, 9 and 10) and PASTBSS (Batches 12 and 13) at various degrees of deprotection was measured and the measurements obtained were plotted against the predicted sulfur content of the polymers. FIG. 5 shows that the actual sulfur content of PTBSS and PASTBSS is identical to the theoretical sulfur content.

Figure 6:
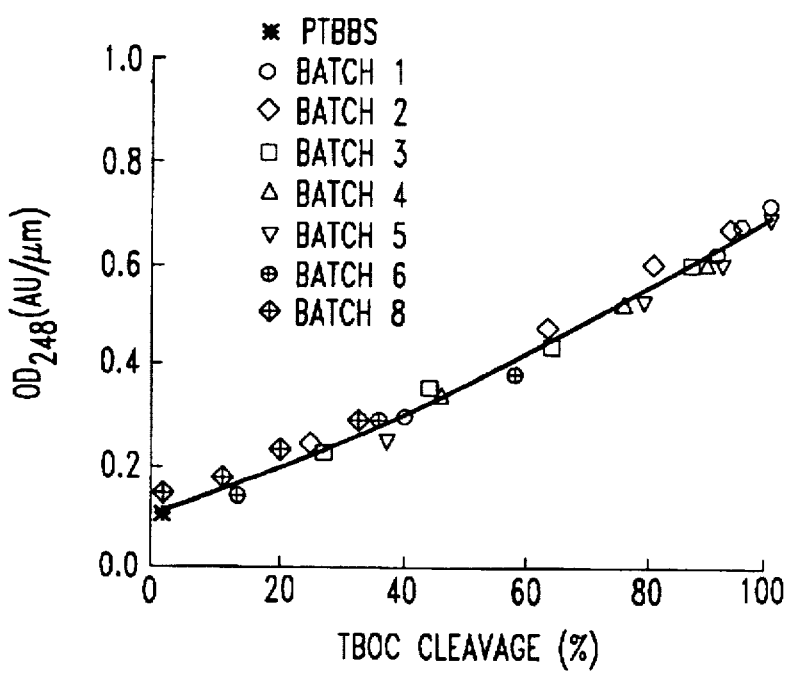
FIG. 6 illustrates the effect of the degree to which the t-butoxycarbonyl groups are cleaved from poly(4-t-butoxycarbonyloxystyrene-sulfone) on the optical density of this polymer at 248 nm.

Example 9: The Effect of the Deprotection Process on the Optical Density of Deprotected Polymers Polymers deprotected by this process, if they are to be used as photoresists in deep ultraviolet applications, must have an acceptable optical density at the wavelength of exposure, such as at 248 nm ($OD_{248}$). FIG. 6 illustrates that the $OD_{248}$ increases with increasing amounts of TBOC cleaved from PTBSS (Batches 1–6 and 8). This increase in optical density was observed regardless of the temperature at which deprotection occurred and regardless of the solvent in which deprotection occurred.

Figure 7:
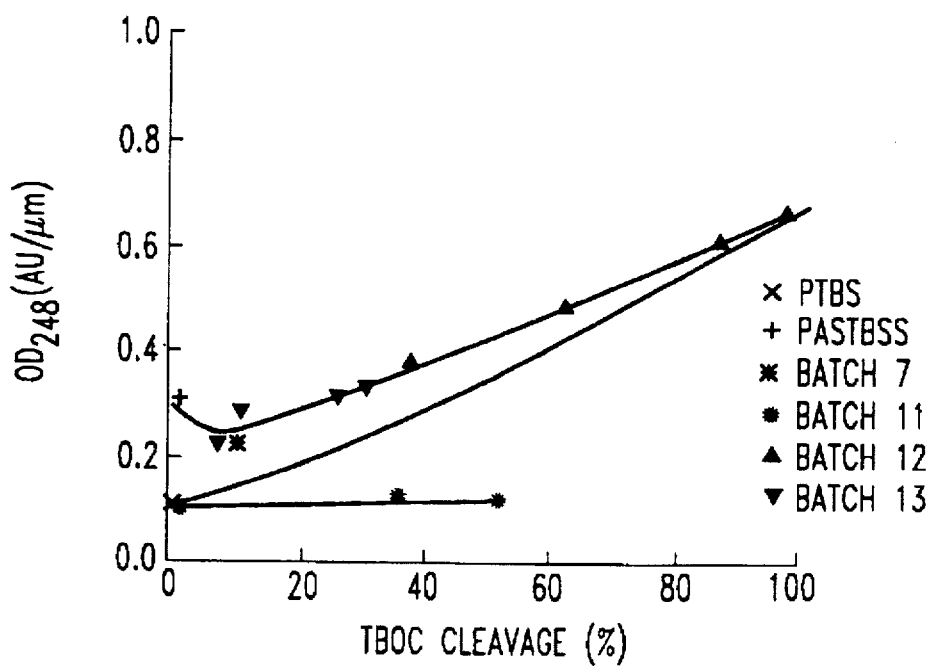
FIG. 7 illustrates the effect of the degree to which the t-butoxycarbonyl groups are cleaved from poly(4-t-butoxycarbonyloxystyrene) and poly(4-acetoxystyrene-4-t-butoxycarbonyloxystyrene-sulfone) on the optical density of these polymers at 248 nm. The solid line is the dam from FIG. 6, provided for comparison.
Figure 8:
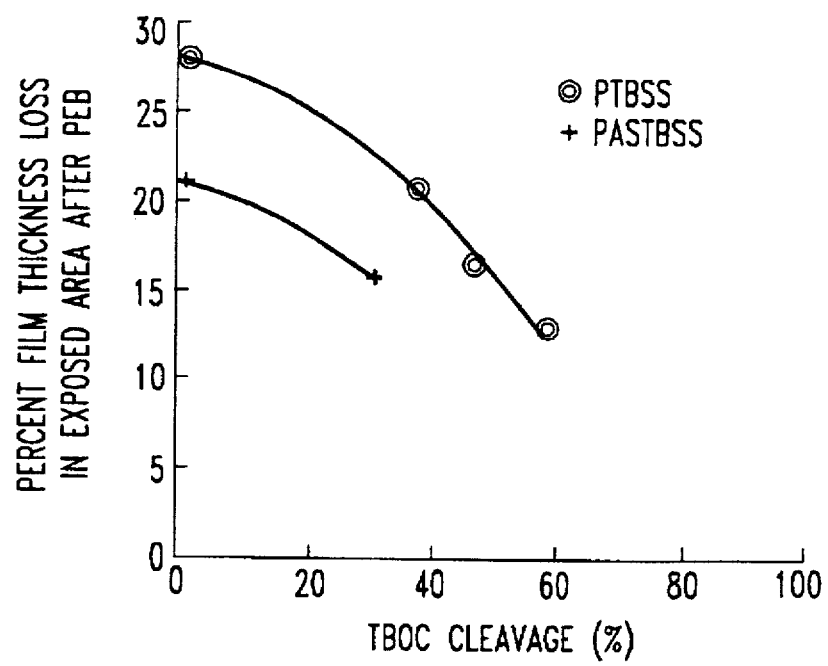
FIG. 8 illustrates the effect of the degree to which the t-butoxycarbonyl groups are cleaved from poly(4-t-butoxycarbonyloxystyrene-sulfone) and poly(4-acetoxystyrene-4-t-butoxycarbonyloxystyrene-sulfone) on the film thickness loss of these resist films during post-exposure baking.

The effect of deprotection on the $OD_{248}$ is, however, dependent upon the polymer being deprotected. A comparison of the $OD_{248}$ versus the amount of TBOC cleaved from PTBS, PTBSS and PASTBSS reveals that the $OD_{248}$ for these various polymers increases at different rates with increased removal of TBOC therefrom. As can be observed from FIG. 7, $OD_{248}$ for PASTBSS (Batches 7, 12 and 13), after decreasing initially, also increased. The solid line represents the observed effect of deprotection on the OD 248 of PTBSS and is provided for the purposes of comparison. The solid line was obtained from the data used to prepare FIG. 6. The $OD_{248}$ for PTBS S increased steadily as more TBOC was cleaved from the polymer. The $OD_{248}$ for PTBS (Batch 1) barely increased with increasing removal of up to fifty percent of the TBOC from the polymer.

Example 10: The Effect of Polymer Deprotection on the Resist Film Thickness Loss During Deprotection As mentioned previously, it is important in lithographic applications to limit the amount by which the resist film shrinks during PEB. As previously noted in Table IV, the film thickness loss of PTBSS (Batches 8, 9 and 10) and PASTBSS (Batch 13) decreased when these polymers were deprotected. The relationship between increasing TBOC cleavage and decreasing film thickness loss during PEB is also illustrated in FIG. 11.

The above examples are for the purpose of illustrating and explaining the invention. They are not intended to limit the invention in any way beyond the spirit and scope of the appended claims.

We claim:

1. A process for producing a chemically amplified resist comprising: dissolving a protected polymer comprising a backbone to which substituent groups are attached and acid labile functional groups that are attached to at least a portion of the substituent groups in an organic solvent with a $pK_a$ of greater than 5 to form a polymer solution; heating the polymer solution to an elevated temperature of about 100° C. to about 150° C.; and maintaining the polymer solution at the elevated temperature for an amount of time sufficient to remove at least 5% of the acid labile functional groups from the polymer to obtain a partially deprotected polymer wherein the partial deprotection is accomplished without adding acid or base to the polymer solution; separating the partially deprotected polymer from the solvent; and after partial deprotection preparing a resist solution by combining the partially deprotected polymer with a spinning solvent.

2. The process according to claim 1 wherein the acid labile functional group is selected from the group consisting of alkyloxycarbonyl and alkyl.

3. The process according to claim 2 wherein the acid labile functional group is t-butoxycarbonyl.

4. The process according to claim 3 wherein the polymer is selected from the group consisting of homopolymers of t-butoxycarbonyloxystyrene and copolymers of t-butoxycarbonyloxystyrene.

5. The process according to claim 4 wherein the polymer is selected from the group consisting of copolymers of styrene and t-butoxycarbonyloxystyrene, copolymers of t-butoxycarbonyloxystyrene and sulfur dioxide, terpolymers of styrene, t-butoxycarbonyloxystyrene and maleimide, terpolymers of acetoxystyrene, t-butoxycarbonyloxystyrene and sulfur dioxide and tetrapolymers of styrene, t-butoxycarbonyloxystyrene, maleimide and N-methylmaleimide.

6. The process according to claim 4 wherein the polymer is a homopolymer of t-butoxycarbonyloxystyrene.

7. The process according to claim 3 wherein the polymer is a copolymer of styrene and N-t-butoxycarbonylmaleimide.

8. The process according to claim 2 wherein the acid labile functional group is t-butyl.

9. The process according to claim 8 wherein the polymer comprises t-butylmethacrylate.

10. The process according to claim 8 wherein the polymer comprises t-butylvinylbenzoate.

11. The process according to claim 1 wherein the organic solvent has a $pK_a$ of at least 15.

12. The process according to claim 11 wherein the organic solvent is selected from the group consisting of dimethylsulfoxide, acetone and cyclohexanone.

13. The process according to claim 1 wherein the amount of time that the polymer solution is maintained at elevated temperature is less than seven hours.

14. The process according to claim 1 wherein the amount of time that the polymer solution is maintained at elevated temperature is less than three hours.

15. The process according to claim 1 further comprising providing an oxygen-free atmosphere for the polymer solution during the time the polymer solution is heated to and maintained at elevated temperature.

* * * * *